US006136693A

United States Patent [19]

Chan et al.

[11] Patent Number: 6,136,693

[45] Date of Patent: *Oct. 24, 2000

[54] METHOD FOR PLANARIZED INTERCONNECT VIAS USING ELECTROLESS PLATING AND CMP

[75] Inventors: Lap Chan, SF, Calif.; Hou Tee Ng, Singapore, Singapore

[73] Assignee: Chartered Semiconductor Manufacturing Ltd., Singapore, Singapore

[ * ] Notice: This patent issued on a continued prosecution application filed under 37 CFR 1.53(d), and is subject to the twenty year patent term provisions of 35 U.S.C. 154(a)(2).

[21] Appl. No.: 08/958,427

[22] Filed: Oct. 27, 1997

[51] Int. Cl.[7] ......................... B05D 5/12; H01L 21/4763; C23C 14/32

[52] U.S. Cl. .......................... 438/633; 438/675; 438/692; 427/97; 427/255.28; 427/98; 204/192.15; 204/192.17

[58] Field of Search ............................... 427/97–99, 255, 427/255.2, 576, 585; 204/192.15, 192.17; 438/627, 633, 648, 650, 653, 656, 674, 692

[56] References Cited

U.S. PATENT DOCUMENTS

| | | | |
|---|---|---|---|
| 4,574,095 | 3/1986 | Baum et al. | 438/650 |
| 5,017,516 | 5/1991 | van der Putten | 437/230 |
| 5,296,407 | 3/1994 | Eguchi | 438/648 |
| 5,308,796 | 5/1994 | Feldman et al. | 437/200 |
| 5,595,937 | 1/1997 | Mikagi | 437/192 |
| 5,595,943 | 1/1997 | Itabashi et al. | 437/230 |
| 5,656,542 | 8/1997 | Miyata et al. | 438/648 |

FOREIGN PATENT DOCUMENTS 798777 10/1997 European Pat. Off. .

OTHER PUBLICATIONS

Palmans et al., Development of an elctroless copper deposition bath for via fill applications on TiN seed layers, Conference ProceedingsULSI–X, Materials Research Society, pp. 87–95, 1995.

*Primary Examiner*—Brian K. Talbot
*Attorney, Agent, or Firm*—George O. Saile; Rosemary L. S. Pike

[57] ABSTRACT

An improved and new method for fabricating conducting vias between successive layers of conductive interconnection patterns in a semiconductor integrated circuit has been developed. The method utilizes a first CMP step to form a barrier lined contact hole, deposition of copper by electroless plating into the barrier lined contact hole, and a second CMP step to remove overgrowth of copper, thus producing coplanarity between the copper surface and the surrounding insulator surface.

34 Claims, 6 Drawing Sheets

METHOD FOR PLANARIZED INTERCONNECT VIAS USING ELECTROLESS PLATING AND CMP

BACKGROUND OF THE INVENTION (1) Field of the Invention

This invention relates to a method of fabrication used for semiconductor integrated circuit devices, and more specifically to an improved method of formation of conducting vias between successive layers of conductive interconnection patterns.

(2) Description of Related Art

The complexity of present-day integrated circuits requires multiple layers of interconnecting conductor lines in order to interconnect the many components in dense circuits. Furthermore, contacts between successive layers of interconnecting conductor lines must have very small surface area and must be spaced at very small intervals in order to achieve maximum wiring density. In order to achieve the necessary small spacing intervals the vias etched through insulating layers between successive layers of interconnecting conductor lines must have nearly vertical sidewalls and dry etching processes such as plasma etching and RIE (Reactive Ion Etching) have been developed to produce vertical sidewall vias. After formation of the vertical sidewall vias, the aspect ratio of vias is generally greater than 3 and often as high as 5 to 10. Aspect ratio is the ratio of the height to the width of the opening defining the via. The metal deposition process used to fill the vias must be capable of filling the vias with conducting metallization which is without voids within the vias. Voids within the via metallization reduce the conductivity of the via and also entrap contaminants which can degrade process yield and integrated circuit reliability. Also, the conducting metallization used to fill the vias must have sufficiently high electrical conductivity to meet the design criteria of the integrated circuits. And, the conducting metallization should be resistant to electromigration resulting from the necessity of the conducting vias to carry high current densities during circuit operation. Additionally, in such multiple layer wiring processes, it is desirable that each layer have a smooth topography since it is difficult to lithographically image and pattern layers applied to rough surfaces. Also, rough surface topography results in poor step coverage by subsequently deposited layers, discontinuity of layers across steps, and void formation between topographic features. Poor step coverage by deposited layers and void formation between topographic features result in degraded process yield and poorer reliability in integrated circuits.

State-of-the-art processes for forming conductor-filled vias include CVD (Chemical Vapor Deposition) of tungsten into openings formed in an insulating layer. However, for large aspect ratios this process results in inclusion of voids or seams within the tungsten-filled vias and, also, requires costly and time-consuming etching or polishing steps to remove the unwanted tungsten from the surface of the insulating layer. In addition, tungsten-filled vias have relatively high resistance due to the relativley low conductivity of tungsten. Blanket deposition of other conducting materials by sputtering and other CVD processes, also, cannot produce voidless filling of vias having large aspect ratios. Plasma etching, subsequent to the filling of vias, to remove unwanted conducting material from the surface of the insulating layer is costly and time consuming because it requires a masking step. Removal of thick blanket layers of conductive material by CMP (Chemical Mechanical Polishing) is, also, costly and has unacceptable non-uniformity of removal.

Therefore, a challenge in the industry is to provide a means of formation of conducting vias between successive layers of conductive interconnection patterns, whereby the conducting via material has high electrical conductivity and is formed without voids within the vias. Also, the means of formation should have low cost and should result in smooth surface topography with the conducting via coplanar with the surrounding insulating layer.

Numerous improvements to methods of forming vias have been invented. For example, U.S. Pat. No. 5,595,943 entitled "Method for Formation of Conductor Using Electroless Plating" granted Jan. 21, 1997 to Takeyuki Itabashi et al describes electroless plating of copper from a copper plating solution which also contains an inhibitor ion, such as lead ion, silver ion, tin ion or other metal ions. The result is the copper conductor metal being deposited and filled in recessions in an insulator to the same level as the surface of the insulator. The plating reaction automatically stops when the metal conductor is formed up to the level of the surface of the insulator.

Also, U.S. Pat. No. 5,017,516 entitled "Method Of Manufacturing a Semiconductor Device" granted May 21, 1991 to Andrean M. T. P. van der Putten describes a method of electroless plating of conductive material into recesses in a dielectric layer, whereby nucleation is in a $PdCl_2$ solution at 70° C.

U.S. Pat. No. 5,595,937 entitled "Method for Fabricating Semiconductor Device with Interconnections Buried in Trenches" granted Jan. 21, 1997 to Kaoru Mikagi shows a method of forming an interconnect using a TiN/Ti film over which a Cu film is grown by a MOCVD (Metal Organic Chemical Vapor Deposition), and thereafter the films are partially removed by CMP (Chemical Mechanical Polishing).

U.S. Pat. No. 5,308,796 entitled "Fabrication of Electronic Devices by Electroless Plating of Copper onto a Metal Silicide" granted May 3, 1994 to Leonard C. Feldman et al describes a method of fabricating devices by electroless plating of copper onto a metal silicide, such as platinum or palladium silicide.

SUMMARY OF THE INVENTION

One object of the present invention is to provide an improved method of formation of conducting vias between successive layers of conductive interconnection patterns.

Another object of the present invention is to provide a new and improved process for formation of conducting vias between successive layers of conductive interconnection patterns, wherein the conducting via material is copper deposited without voids.

A further object of the present invention is to provide a new and improved process for formation of copper conducting vias for use in silicon semiconductor integrated circuits, wherein a barrier layer prevents diffusion of copper into silicon devices.

And yet another object of the present invention is to provide a new and improved process for formation of copper conducting vias at low cost and which have a coplanar surface with the surrounding insulating layer.

The method in accordance with the invention comprises, after etching narrow contact openings in an insulating layer, in depositing a barrier layer, such as TiN, WN or TaN, onto the surface of the insulating layer and into the contact openings. A first CMP (Chemical Mechanical Polishing) is used to remove the barrier layer from the surface of the insulating layer, leaving contact openings lined with the barrier layer. A substrate cleaning step follows the first CMP of the barrier layer. Next an activation layer comprising Pd or Pt is selectively deposited onto the barrier layer lining the contact openings. Then copper is selectively deposited onto the activated barrier layer using electroless plating, resulting in voidless filling of the contact openings with copper with a small overgrowth of the copper above the surface of the insulating layer. A second CMP (Chemical Mechanical Polishing) is used to remove the overgrowth of the copper, producing coplanar surfaces of copper and insulating layer material. The method can be used for forming vias which contact the semiconductor substrate regions or for vias which form contacts between successive layers of interconnecting conductor lines.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method of formation of conducting vias between successive layers of conductive interconnection patterns for use in semi conductor integrated circuits will now be described in detail.

Figure 1A:
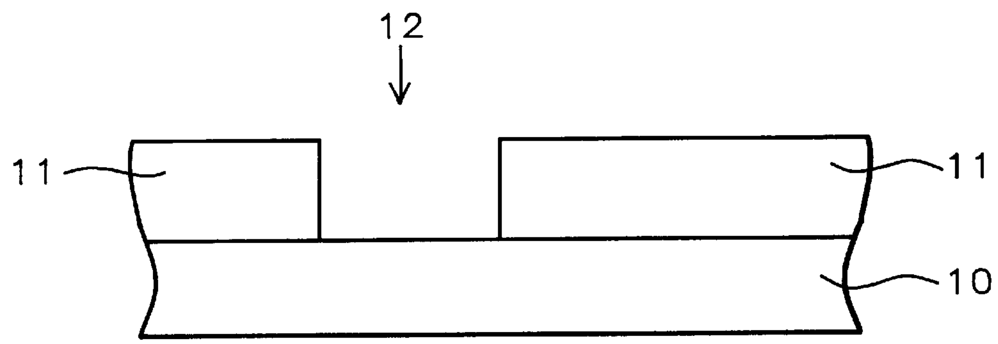
FIGS. 1A–1F, which schematically, in cross-sectional representation, illustrate the method of one embodiment of the present invention.
Figure 1B:
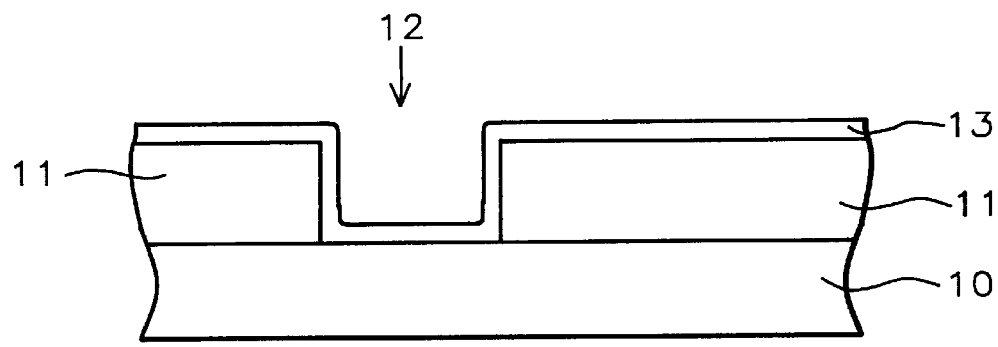
Figure 1C:
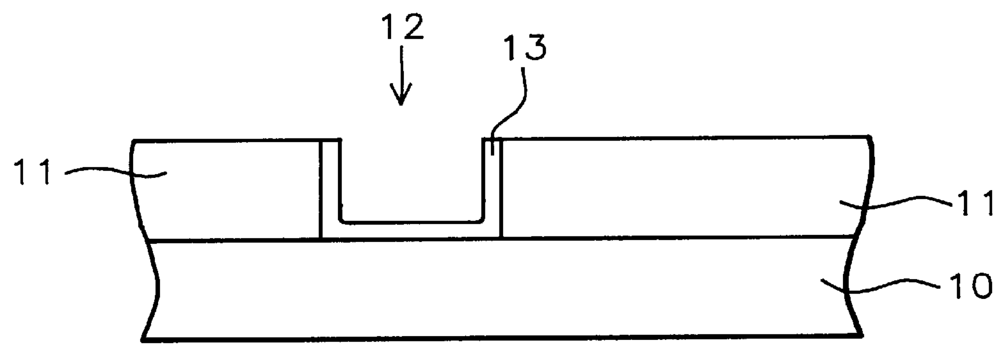
Figure 1D:
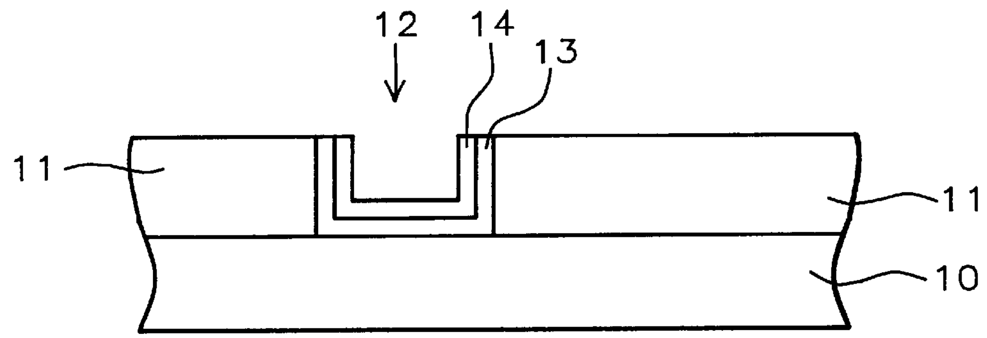
Figure 1E:
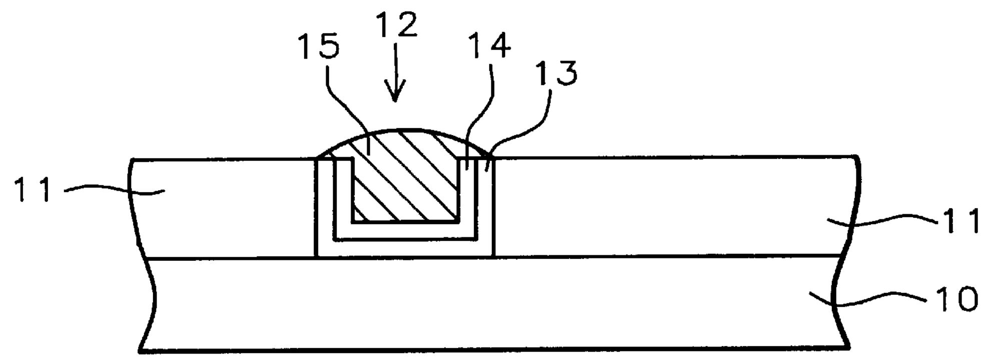
Figure 1F:
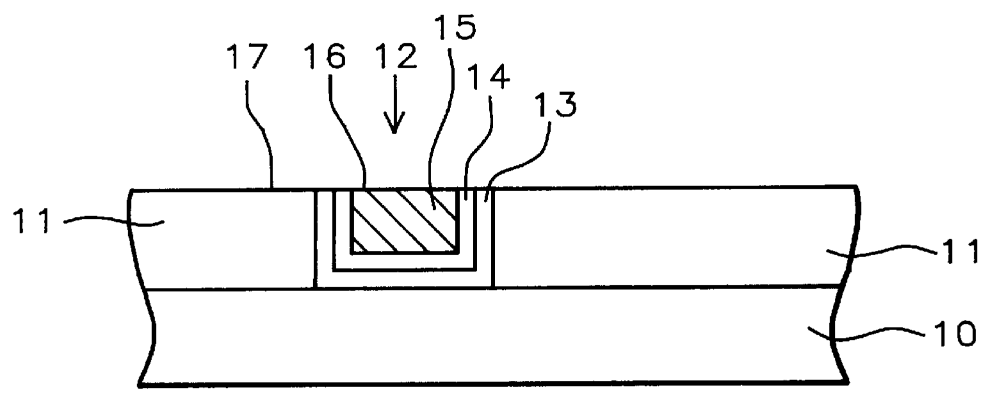

Referring to FIGS. 1A–1F, semiconductor substrate 10 is coated with an insulating layer 11, having narrow contact openings 12 etched therein. Semiconductor substrate 10 may be P-type single crystal silicon, but is not limited thereto. Insulating layer 11 is generally $SiO_2$ having a thickness between about 4000 and 10,000 Angstroms. Alternatively, other insulating layers such as $Si_3N_4$, spin-on-glass, and synthetic resins such as polyimide may be used. The width of the contact openings may be in a range between about 1000 and 6000 Angstroms. The contact openings 12 are formed by conventional lithographic and plasma etching processes and generally have vertical sidewalls. Barrier layer 13 is deposited conformally onto the surface of the insulating layer 11 and into the contact openings 12. Barrier layer 13 may be TiN deposited by collimator, ionized metal plasma, or CVD techniques and have a thickness between about 50 and 400 Angstroms. Alternatively, barrier layer 13 may be WN deposited by CVD methods or TaN deposited by sputtering or CVD methods and have a thickness between about 50 and 400 Angstroms. The barrier layer will surround subsequently deposited copper and prevent the copper from diffusing into the semiconductor substrate. A first CMP (Chemical Mechanical Polishing) step is used to selectively remove the barrier layer 13 from the surface of the insulating layer 11. The first CMP is performed using a conventional polishing apparatus and a polishing slurry comprising alumina ($Al_2O_3$), hydrogen peroxide ($H_2O_2$), and ammonium hydroxide ($NH_4OH$). Also, an oxidizer such as $KIO_3$, $NaIO_3$ or $NaClO_3$ may be added to the polishing slurry to enhance the polish removal rate. A conventional cleaning step is used to remove residues following the first CMP step. Activation layer 14 is selectively formed on the barrier layer 13 remaining on the inside walls of the contact openings. The activation layer 14 may be Pd formed in an aqueous solution containing $PdCl_2$, HF (50:1), HCl, and glacial acetic acid at a temperature between about 25 and 80° C. Alternatively, the activation layer 14 may be Pt formed in an aqueous solution containing $PtCl_2$, HF, and $NH_4F$ at a temperature between about 25 and 80° C. The action of the aqueous nucleating solution is based on an exchange reaction between the noble metal, Pd or Pt, and the barrier layer, TiN, WN or TaN. No exchange reaction takes place between Pd or Pt and the insulating layer, so only the barrier layer remaining on the inside surfaces of the contact openings becomes activated during this step. Next copper 15 is deposited selectively on the activation layer 14 by electroless plating from a solution comprising $CuSO_4.5H_2O$, formaldehyde (HCHO), EDTA, polyethylene glycol, and tetramethylammoniamhydroxide (TMAH) at a temperature between about 25 and 80° C. Electroless deposition of copper is continued for a time sufficient to fill the contact openings and result in a small overgrowth of copper above the surface of the insulating layer 11. The height of the overgrowth of copper above the surface of the insulating layer is preferably in a range of between about 500 and 2000 Angstroms. The height of the overgrowth of copper is not critical and may be as large as 3000 Angstroms. Finally, a second CMP (Chemical Mechanical Polishing) step is performed, using a polishing slurry comprising alumina ($Al_2O_3$), hydrogen peroxide ($H_2O_2$), and $Fe(NO_3)_3$. Also, an oxidizer such as $KIO_3$, $NaIO_3$ or $NaClO_3$ may be added to the polishing slurry to enhance the polish removal rate. The second CMP step removes the overgrowth of copper and produces coplanarity of copper surface 16 and insulating layer surface 17. The second CMP step is extremely effective in producing smooth topography and coplanarity of copper surface 16 and insulating layer surface 17 because CMP preferentially removes high regions from the surface of the polished substrate. The result is a conducting via formed of copper, surrounded by a barrier layer of TiN, WN or TaN and having a smooth surface coplanar with the surrounding insulating layer.

Figure 2A:
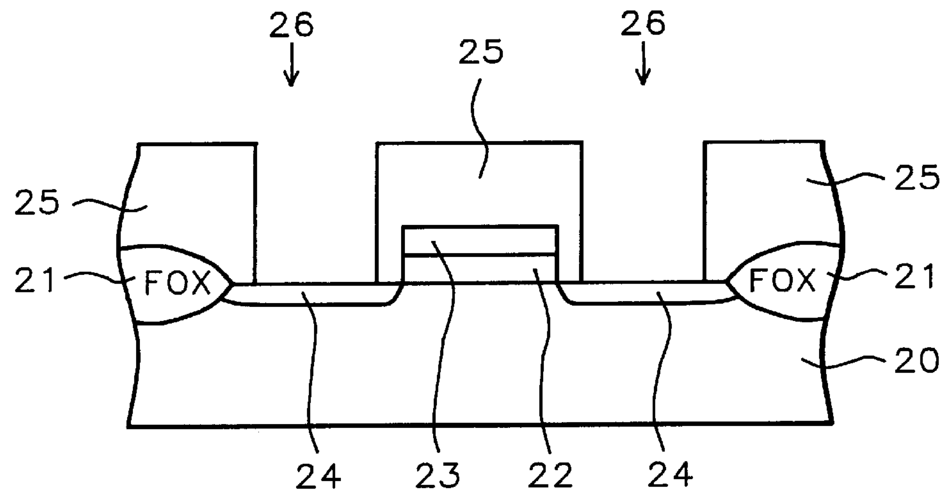
FIGS. 2A–2F, which schematically in cross-sectional representation, illustrate the method of a second embodiment of the present invention.
Figure 2B:
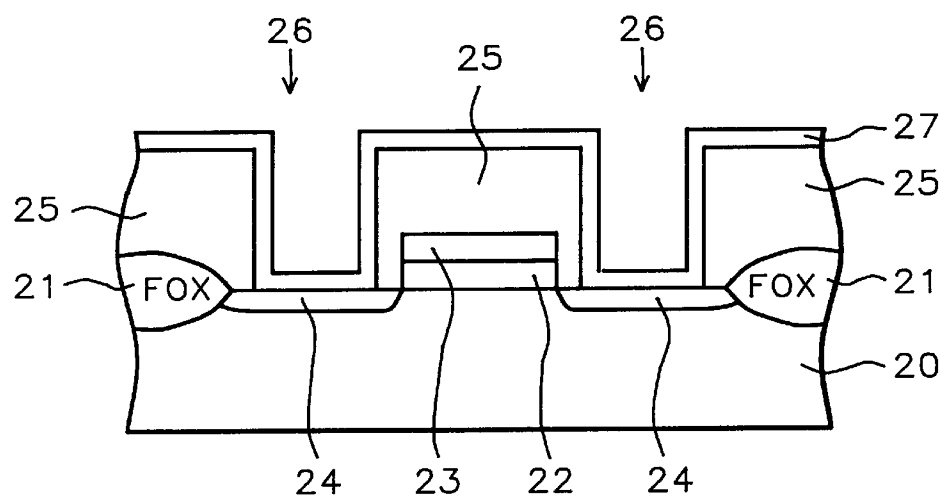
Figure 2C:
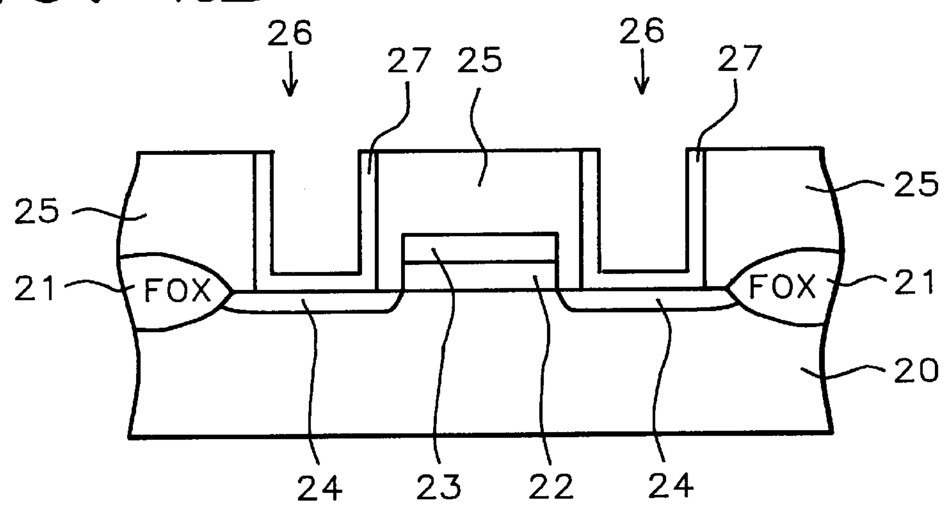
Figure 2D:
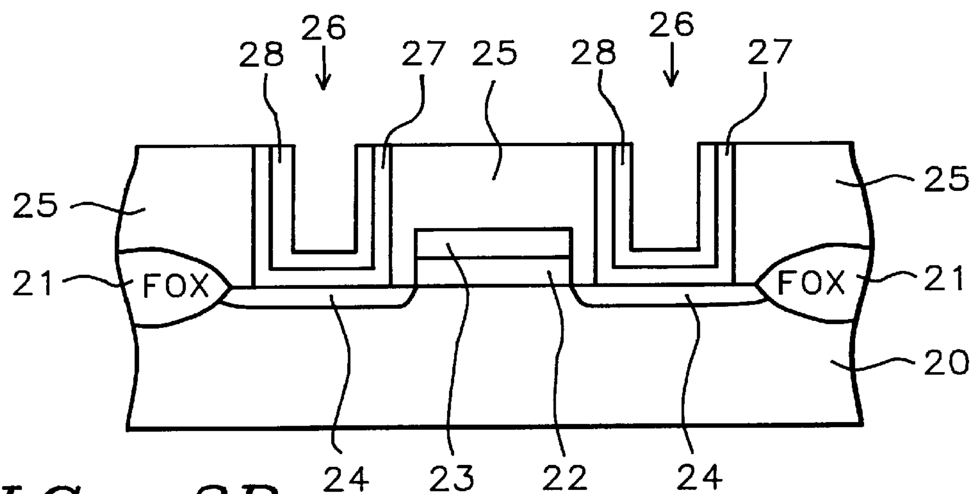
Figure 2E:
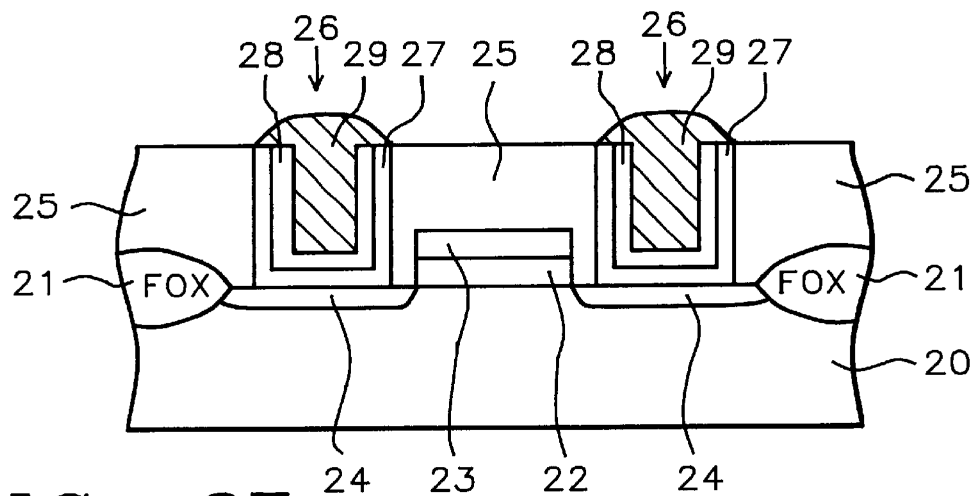
Figure 2F:
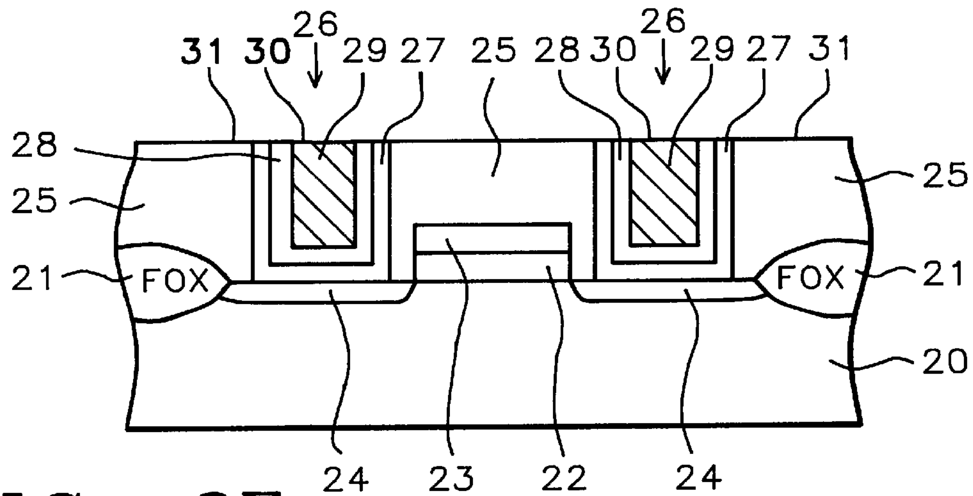

Referring to FIGS. 2A–2F, a second embodiment of the present invention is illustrated, wherein contact to the active device elements of a MOSFET device is made using the method of the present invention. Semiconductor substrate 20 is preferably composed of monocrystalline silicon. A thick field oxide region 21, (FOX), is formed surrounding the region where the device is to be built. Conventional processes are used to form gate oxide 22, gate electrode 23, and source and drain regions 24. An interlevel dielectric layer 25 is deposited using SACVD (Sub Atmospheric Chemical Vapor Deposition) or HDP (High Density Plasma) deposition at a temperature between about 350 and 600° C., to a thickness between about 4000 and 10,000 Angstroms. Conventional lithographic procedures are used to expose areas of the interlevel dielectric layer 25 and RIE (Reactive Ion Etching) is used to etch contact openings to the source and drain regions 24. Photoresist removal and subsequent wet chemical cleanups result in contact openings 26. Conventional processes are used to form silicide or polycide contact layers in the contact openings. Utilization of the present invention begins with deposition of barrier layer 27 conformally onto the surface of the interlevel dielectric layer 25 and into the contact openings 26. Barrier layer 27 may be TiN deposited by collimator, ionized metal plasma, or CVD techniques and have a thickness between about 50 and 400 Angstroms. Alternatively, barrier layer 27 may be WN deposited by CVD methods or TaN deposited by sputtering or CVD methods and have a thickness between about 50 and 400 Angstroms. The barrier layer will surround subsequently deposited copper and prevent the copper from diffusing into the source and drain regions 24. A first CMP (Chemical Mechanical Polishing) step is used to selectively remove the barrier layer 27 from the surface of the interlevel dielectric layer 25. The first CMP is performed using a conventional polishing apparatus and a polishing slurry comprising $Al_2O_3$, $H_2O_2$, and $NH_4OH$. Also, an oxidizer such as $KIO_3$, $NaIO_3$ or $NaClO_3$ may be added to the polishing slurry to enhance the polish removal rate. A conventional cleaning step is used to remove residues following the first CMP step. Activation layer 28 is selectively formed on the barrier layer 27 remaining on the inside walls of the contact openings. The activation layer 28 may be Pd formed in an aqueous solution containing $PdCl_2$, HCl, HF (50:1) and glacial acetic acid at a temperature between about 25 and 80° C. Alternatively, the activation layer 28 may be Pt formed in an aqueous solution containing $PtCl_2$, HF, and $NH_4F$ at a temperature between about 25 and 80° C. The action of the aqueous nucleating solution is based on an exchange reaction between the noble metal, Pd or Pt, and the barrier layer, TiN, WN or TaN. No exchange reaction takes place between Pd or Pt and the interlevel dielectric layer, so only the barrier layer remaining on the inside surfaces of the contact openings becomes activated during this step. Next copper 29 is deposited selectively on the activation layer 28 by electroless plating from a solution comprising $CuSO_4.5H_2O$, formaldehyde (HCHO), EDTA, polyethylene glycol, and tetramethylammoniamhydroxide (TMAH) at a temperature between about 25 and 80° C. Electroless deposition of copper is continued for a time sufficient to fill the contact openings and result in a small overgrowth of copper above the surface of the interlevel dielectric layer 25. The height of the overgrowth of copper above the surface of the interlevel dielectric layer is preferably in a range of between about 500 and 2000 Angstroms. The height of the overgrowth of copper is not critical and may be as large as 3000 Angstroms. Finally, a second CMP (Chemical Mechanical Polishing) step is performed, using a polishing slurry comprising $Al_2O_3$, $H_2O_2$, and $Fe(NO_3)_3$ to remove the overgrowth of copper and produce coplanarity of copper surface 30 and interlevel dielectric surface 31. Also, an oxidizer such as $KIO_3$, $NaIO_3$ or $NaClO_3$ may be added to the polishing slurry to enhance the polish removal rate. The second CMP step is extremely effective in producing smooth topography and coplanarity of copper surface 30 and interlevel dielectric layer suface 31 because CMP preferentially removes high regions from the surface of the polished substrate. The result is a conducting via formed of copper, surrounded by a barrier layer of TiN, WN or TaN and having a smooth surface coplanar with the surrounding interlevel dielectric layer.

Figure 3A:
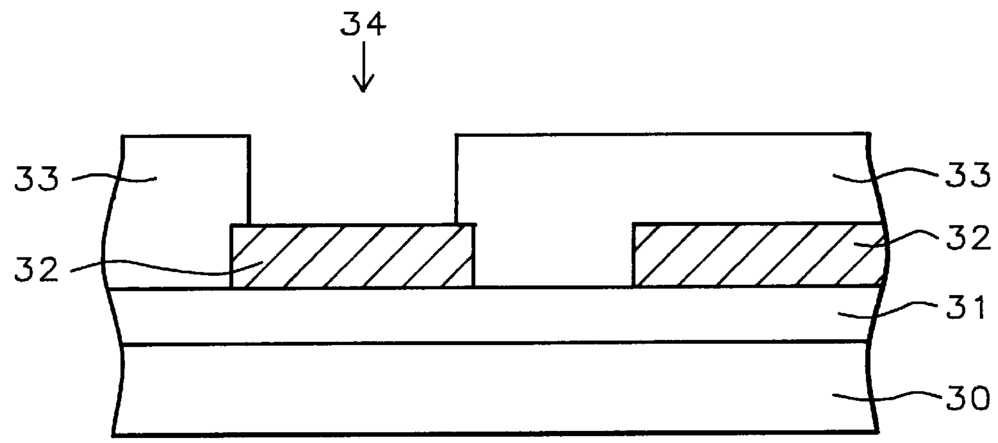
FIGS. 3A–3F, which schematically in cross-sectional representation, illustrate the method of a third embodiment of the present invention.
Figure 3B:
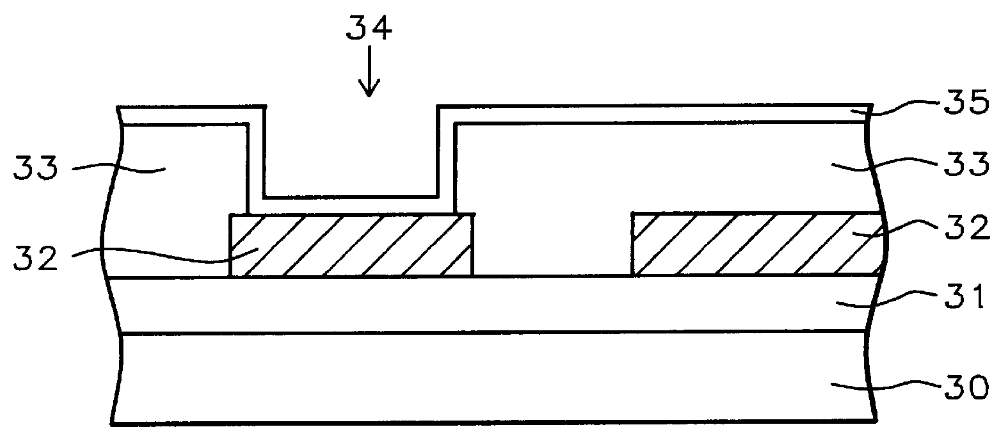
Figure 3C:
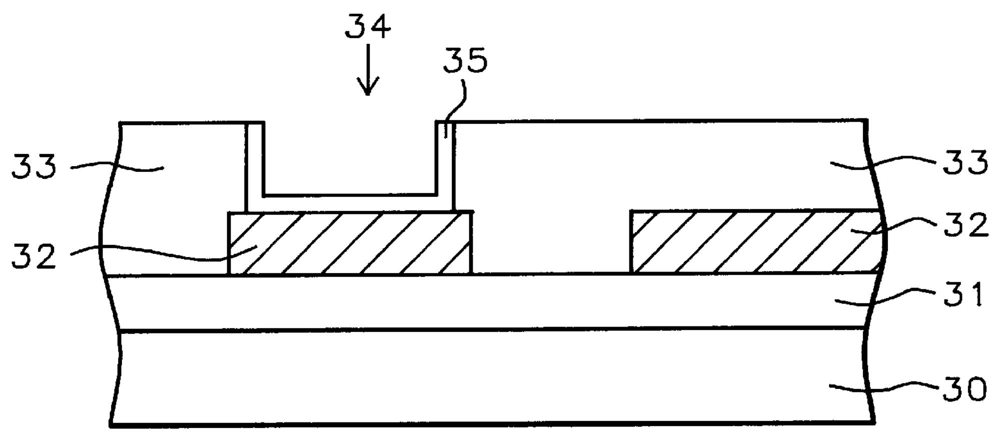
Figure 3D:
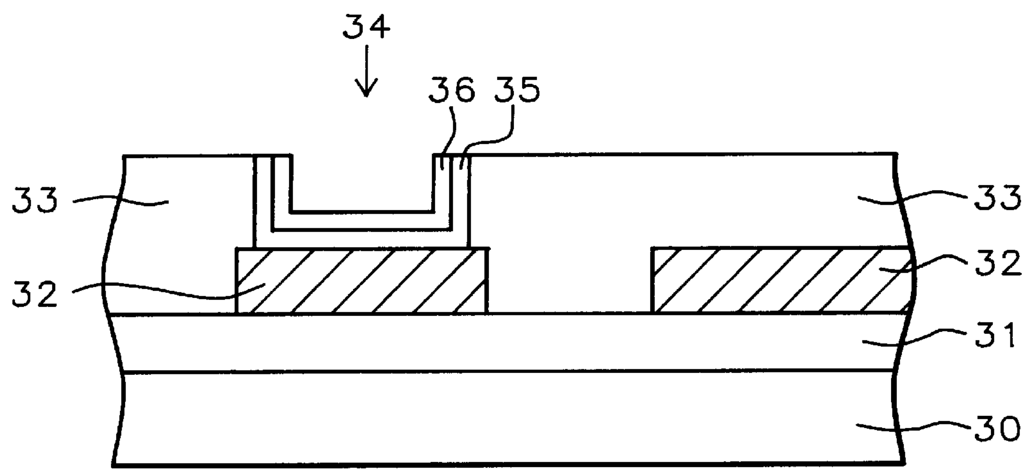
Figure 3E:
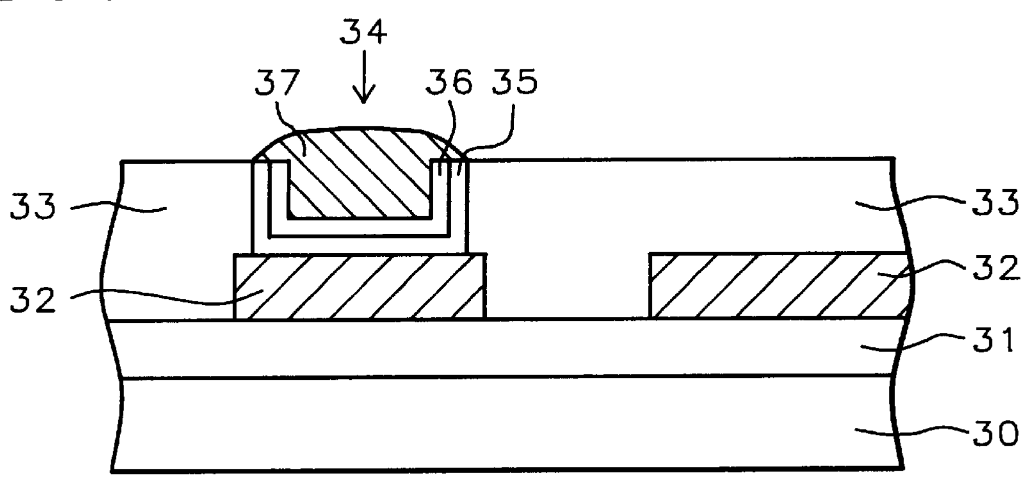
Figure 3F:
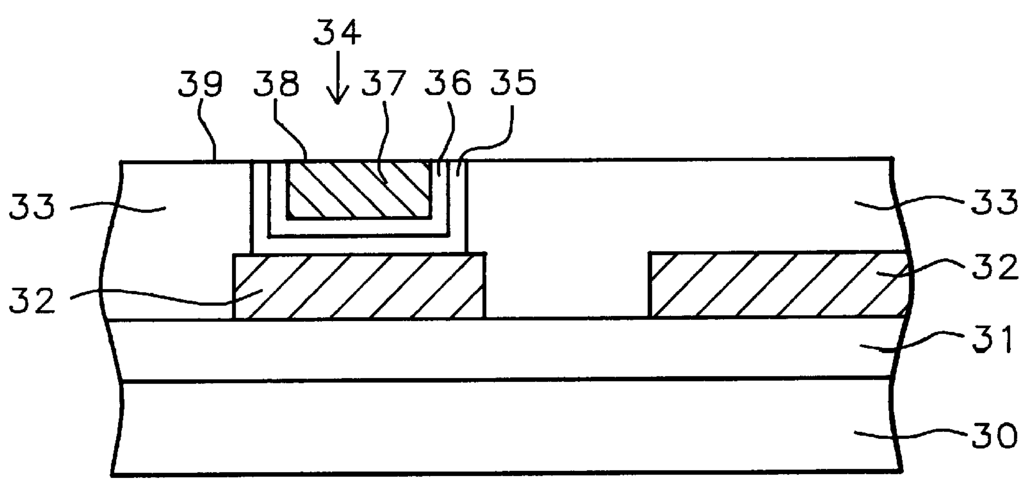

Referring to FIGS. 3A–3F, a third embodiment of the present invention is illustrated, wherein contact to a metallization pattern is made using the method of the present invention. Semiconductor substrate 30 has a first insulating layer 31 deposited thereon. A metallization pattern 32 is formed on first insulating layer 31 by conventional processes. A second insulating layer 33 is deposited over the metallization pattern 32 and the first insulating layer 31. Conventional lithographic procedures are used to expose areas of the second insulating layer 33 and RIE (Reactive Ion Etching) is used to etch contact openings 34 to elements of the metallization pattern 32. Utilization of the present invention begins with deposition of barrier layer 35 conformally onto the surface of the second insulating layer 33 and into the contact openings 34. Barrier layer 35 may be TiN deposited by collimator, ionized metal plasma, or CVD techniques and have a thickness between about 50 and 400 Angstroms. Alternatively, barrier layer 27 may be WN deposited by CVD methods or TaN deposited by sputtering or CVD methods and have a thickness between about 50 and 400 Angstroms. The barrier layer will surround subsequently deposited copper. A first CMP (Chemical Mechanical Polishing) step is used to selectively remove the barrier layer 35 from the surface of the second insulating layer 33. The first CMP is performed using a conventional polishing apparatus and a polishing slurry comprising $Al_2O_3$, $H_2O_2$, and $NH_4OH$. Also, an oxidizer such as $KIO_3$, $NaIO_3$ or $NaClO_3$ may be added to the polishing slurry to enhance the polish removal rate. A conventional cleaning step is used to remove residues following the first CMP step. Activation layer 36 is selectively formed on the barrier layer 35 remaining on the inside walls of the contact openings. The activation layer 36 may be Pd formed in an aqueous solution containing $PdCl_2$, HCl, HF (50:1) and glacial acetic acid at a temperature between about 25 and 80° C. Alternatively, the activation layer 36 may be Pt formed in an aqueous solution containing $PtCl_2$, HF, and $NH_4F$ at a temperature between about 25 and 80° C. The action of the aqueous nucleating solution is based on an exchange reaction between the noble metal, Pd or Pt, and the barrier layer, TiN, WN or TaN. No exchange reaction takes place between Pd or Pt and the second insulating layer, so only the barrier layer remaining on the inside surfaces of the contact openings becomes activated during this step. Next copper 37 is deposited selectively on the activation layer 36 by electroless plating from a solution comprising $CuSO_4.5H_2O$, formaldehyde (HCHO), EDTA, polyethylene glycol, and tetramethylammoniamhydroxide (TMAH) at a temperature between about 25 and 80° C. Electroless deposition of copper is continued for a time sufficient to fill the contact openings and result in a small overgrowth of copper above the surface of the second insulating layer 33. The height of the overgrowth of copper above the surface of the second insulating layer is preferably in a range of between about 500 and 2000 Angstroms. The height of the overgrowth of copper is not critical and may be as large as 3000 Angstroms. Finally, a second CMP (Chemical Mechanical Polishing) step is performed, using a polishing slurry comprising $Al_2O_3$, $H_2O_2$, and $Fe(NO_3)_3$ to remove the overgrowth of copper and produce coplanarity of copper surface 38 and the second insulating layer surface 39. Also, an oxidizer such as $KIO_3$, $NaIO_3$ or $NaClO_3$ may be added to the polishing slurry to enhance the polish removal rate. The second CMP step is extremely effective in producing smooth topography and coplanarity of copper surface 38 and second insulating layer surface 39 because CMP preferentially removes high regions from the surface of the polished substrate. The result is a conducting via formed of copper, surrounded by a barrier layer of TiN, WN or TaN and having a smooth surface coplanar with the surrounding second insulating layer.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of integrated circuit interconnection vias on a semiconductor substrate having an insulating layer, said insulating layer having contact openings etched therein, comprising the steps of:

providing said semiconductor substrate having an insulating layer containing contact openings etched therein;

forming a barrier layer, comprising TiN, WN or TaN onto the surface of the insulating layer and into the contact openings, forming said barrier layer onto the sidewalls and bottom of said contact openings;

using a first CMP (Chemical Mechanical Polishing) to remove said barrier layer from the surface of said insulating layer, leaving contact openings lined with said barrier layer;

cleaning said semiconductor substrate;

forming an activation layer comprising Pd or Pt onto the barrier layer lining said contact openings;

depositing copper by electroless plating onto said activation layer as formed onto said barrier layer lining said contact openings;

continuing deposition of copper by electroless plating to fill said contact openings and result in an overgrowth of copper above the surface of the insulating layer; and using a second CMP (Chemical Mechanical Polishing) to remove said overgrowth of copper, thereby producing coplanar surfaces of copper and insulating layer materials.

2. The method of claim 1, wherein said barrier layer is TiN deposited by collimator or CVD deposition processes and having a thickness between about 50 and 400 Angstroms.

3. The method of claim 1, wherein said barrier layer is WN deposited by chemical vapor deposition and having a thickness between about 50 and 400 Angstroms.

4. The method of claim 1, wherein said barrier layer is TaN deposited by sputtering or CVD deposition processes and having a thickness between about 50 and 400 Angstroms.

5. The method of claim 1, wherein said first CMP is performed using a polishing slurry comprising $Al_2O_3$, $H_2O_2$ and $NH_4OH$.

6. The method of claim 1, wherein said activation layer is Pd formed in an aqueous solution containing $PdCl_2$, HCl, HF and glacial acetic acid at a temperature between about 25 and 80° C.

7. The method of claim 1, wherein said activation Layer is Pt formed in an aqueous solution containing $PtCl_2$, HF and $NH_4F$ at a temperature between about 25 and 80° C.

8. The method of claim 1, wherein said copper is deposited by electroless plating from a solution comprising $CuSO_4.5H_2O$, HCHO (formaldehyde), EDTA, TMAH (tetramethylammoniahydroxide) and polyethylene glycol at a temperature between about 25 and 80° C.

9. The method of claim 1, wherein said overgrowth of copper above the surface of the insulating layer has a height between about 500 and 2000 Angstroms.

10. The method of claim 1, wherein said second CMP is performed using a polishing slurry comprising $Al_2O_3$, $H_2O_2$ and $Fe(NO_3)_3$.

11. The method of claim 1, wherein said second CMP is performed using a polishing slurry comprising $Al_2O_3$, $H_2O_2$ and $Fe(NO_3)_3$ and an oxidizer such as $KIO_3$, $NaIO_3$ or $NaClO_3$.

12. A method of fabricating a MOSFET device on a semiconductor substrate, wherein contact to the active device element comprises the steps of:

providing said active device element in said semiconductor substrate;

depositing an interlevel dielectric layer on said semiconductor substrate, that includes said active device element;

providing a contact opening, etched through said interlevel dielectric layer, to said active device element;

forming a barrier layer, comprising TiN, WN or TaN onto the surface of the interlevel dielectric layer and into the contact opening, forming said barrier layer onto the sidewalls and bottom of said contact opening;

using a first CMP (Chemical Mechanical Polishing) to remove said barrier layer from the surface of said interlevel dielectric layer, leaving said contact opening lined with said barrier layer;

cleaning said semiconductor substrate;

forming an activation layer comprising Pd or Pt onto the barrier layer lining said contact opening;

depositing copper by electroless plating onto said activation layer as formed onto said barrier layer lining said contact opening;

continuing deposition of copper by electroless plating to fill said contact opening and result in an overgrowth of copper above the surface of the interlevel dielectric layer; and using a second CMP (Chemical Mechanical Polishing) to remove said overgrowth of copper, thereby producing coplanar surfaces of copper and interlevel dielectric layer materials.

13. The method of claim 12, wherein said barrier layer is TiN deposited by collimator or CVD deposition processes and having a thickness between about 50 and 400 Angstroms.

14. The method of claim 12, wherein said barrier layer is WN deposited by chemical vapor deposition and having a thickness between about 50 and 400 Angstroms.

15. The method of claim 12, wherein said barrier layer is TaN deposited by sputtering or CVD deposition processes and having a thickness between about 50 and 400 Angstroms.

16. The method of claim 12, wherein said first CMP is performed using a polishing slurry comprising $Al_2O_3$, $H_2O_2$ and $NH_4OH$.

17. The method of claim 12, wherein said first CMP is performed using a polishing slurry comprising $Al_2O_3$, $H_2O_2$ and $NH_4OH$ and an oxidizer such as $KIO_3$, $NaIO_3$ or $NaClO_3$.

18. The method of claim 12, wherein said activation layer is Pd formed in an aqueous solution containing $PdCl_2$, HCl, HF and glacial acetic acid at a temperature between about 25 and 80° C.

19. The method of claim 12, wherein said activation layer is Pt formed in an aqueous solution containing $PtCl_2$, HF and $NH_4F$ at a temperature between about 25 and 80° C.

20. The method of claim 12, wherein said copper is deposited by electroless plating from a solution comprising $CuSO_4.5H_2O$, HCHO (formaldehyde), EDTA, TMAH (tetramethylammoniahydroxide) and polyethylene glycol at a temperature between about 25 and 80° C.

21. The method of claim 12, wherein said overgrowth of copper above the surface of the interlevel dielectric layer has a height between about 500 and 2000 Angstroms.

22. The method of claim 12, wherein said second CMP is performed using a polishing slurry comprising $Al_2O_3$, $H_2O_2$ and $Fe(NO_3)_3$.

23. The method of claim 12, wherein said second CMP is performed using a polishing slurry comprising $Al_2O_3$, $H_2O_2$ and $Fe(NO_3)_3$ and an oxidizer such as $KIO_3$, $NaIO_3$ or $NaClO_3$.

24. A method of fabrication of an interconnection layer in an integrated circuit comprising:

depositing an insulating layer over a metallization pattern;

providing contact openings, etched through said insulating layer and exposing elements of said metallization pattern;

forming a barrier layer, comprising TiN, WN or TaN onto the surface of said insulating layer and into said contact openings, forming said barrier layer onto the sidewalls and bottom of said contact openings;

using a first CMP (Chemical Mechanical Polishing) to remove said barrier layer from the surface of said insulating layer, leaving contact openings lined with said barrier layer;

cleaning said semiconductor substrate;

forming an activation layer comprising Pd or Pt onto the barrier layer lining said contact openings;

depositing copper by electroless plating onto said activation layer as formed onto said barrier layer lining said contact openings;

continuing deposition of copper by electroless plating to fill said contact openings and result in an overgrowth of copper above the surface of the insulating layer; and using a second CMP (Chemical Mechanical Polishing) to remove said overgrowth of copper, thereby producing coplanar surfaces of copper and insulating layer materials.

25. The method of claim 24, wherein said barrier layer is TiN deposited by collimator or CVD deposition processes and having a thickness between about 50 and 400 Angstroms.

26. The method of claim 24, wherein said barrier layer is WN deposited by chemical vapor deposition and having a thickness between about 50 and 400 Angstroms.

27. The method of claim 24, wherein said barrier layer is TaN deposited by sputtering or CVD deposition processes and having a thickness between about 50 and 400 Angstroms.

28. The method of claim 24, wherein said first CMP is performed using a polishing slurry comprising $Al_2O_3$, $H_2O_2$ and $NH_4OH$.

29. The method of claim 24, wherein said activation layer is Pd formed in an aqueous solution containing $PdCl_2$, HCl, HF and glacial acetic acid at a temperature between about 25 and 80° C.

30. The method of claim 24, wherein said activation layer is Pt formed in an aqueous solution containing $PtCl_2$, HF and $NH_4F$ at a temperature between about 25 and 80° C.

31. The method of claim 24, wherein said copper is deposited by electroless plating from a solution comprising $CuSO_4.5H_2O$, HCHO (formaldehyde), EDTA, TMAH (tetramethylammoniahydroxide) and polyethylene glycol at a temperature between about 25 and 80° C.

32. The method of claim 24, wherein said overgrowth of copper above the surface of the insulating layer has a height between about 500 and 2000 Angstroms.

33. The method of claim 24, wherein said second CMP is performed using a polishing slurry comprising $Al_2O_3$, $H_2O_2$ and $Fe(NO_3)_3$.

34. The method of claim 24, wherein said second CMP is performed using a polishing slurry comprising $Al_2O_3$, $H_2O_2$ and $Fe(NO_3)_3$ and an oxidizer such as $KIO_3$, $NaIO_3$ or $NaClO_3$.

* * * * *